United States Patent
Kolosov et al.

(10) Patent No.: US 8,264,157 B2
(45) Date of Patent: Sep. 11, 2012

(54) ELECTRONIC DEVICE INCLUDING AN ORGANIC DIODE AND A SHUNT AND A PROCESS OF FORMING THE SAME

(76) Inventors: Dmitry Kolosov, Goleta, CA (US); Johann Thomas Trujillo, Goleta, CA (US); Andrew Wesley Johnson, Santa Barbara, CA (US); Ameen K. Saafir, Goleta, CA (US)

( * ) Notice: Subject to any disclaimer, the term of this patent is extended or adjusted under 35 U.S.C. 154(b) by 0 days.

(21) Appl. No.: 12/410,890

(22) Filed: Mar. 25, 2009

(65) Prior Publication Data
US 2011/0025212 A1    Feb. 3, 2011

Related U.S. Application Data

(60) Provisional application No. 61/039,566, filed on Mar. 26, 2008.

(51) Int. Cl.
*G09G 3/30* (2006.01)
(52) U.S. Cl. .............. 315/169.3; 315/185 R; 345/76; 345/92
(58) Field of Classification Search .......... 313/501, 313/503, 504, 506, 507; 315/185 R, 291, 315/194; 345/76, 82, 92
See application file for complete search history.

(56) References Cited

U.S. PATENT DOCUMENTS

| | | | | |
|---|---|---|---|---|
| 6,781,321 B2* | 8/2004 | Ko et al. | ...................... | 315/169.3 |
| 7,592,985 B2* | 9/2009 | Kim et al. | ......................... | 345/82 |
| 2006/0290623 A1* | 12/2006 | Okabe et al. | .................... | 345/82 |
| 2007/0120796 A1* | 5/2007 | Marx | ............................... | 345/92 |
| 2007/0273622 A1* | 11/2007 | Huang | ............................ | 345/76 |
| 2008/0030438 A1* | 2/2008 | Marx et al. | ...................... | 345/82 |
| 2008/0197784 A1* | 8/2008 | Benzarti | .................... | 315/169.3 |

\* cited by examiner

*Primary Examiner* — Vibol Tan

(57) ABSTRACT

An electronic device can include an organic diode and a shunt that allows a significant current to bypass the organic diode, wherein the shunt is separate from the organic diode. Alternatively, an electronic device can include an organic diode lying along a first conduction path. The electronic device can also include a resistive member lying along a second conduction path that is parallel to the first conduction path. In another aspect, a process of forming an electronic device can include forming a first conductive member, forming a resistive member over the first conductive member, and forming an organic semiconductor layer over the first conductive member. The process can also include forming a second conductive member over the resistive member and the organic semiconductor layer, such that the resistive member and the organic semiconductor layer lie along parallel conduction paths between the first and second conductive members.

11 Claims, 13 Drawing Sheets

ELECTRONIC DEVICE INCLUDING AN ORGANIC DIODE AND A SHUNT AND A PROCESS OF FORMING THE SAME

CROSS REFERENCE TO RELATED APPLICATION

This application claims the benefit of priority under 35 U.S.C. §119(e) from provisional U.S. Application No. 61/039,566, filed Mar. 26, 2008, which is incorporated herein by reference in its entirety.

FIELD OF THE DISCLOSURE

This disclosure relates in general to electronic devices and processes, and more particularly, to electronic devices including organic diodes and shunts and processes of forming the same.

DESCRIPTION OF THE RELATED ART

An electronic device can include a liquid crystal display ("LCD"), an organic light-emitting diode (OLED) display, or the like. Unlike an LCD display, an OLED display can have a power transistor operating nearly all of the time when the OLED display is illuminated. The nearly constant biasing of the power transistor can allow charge to be trapped within the gate dielectric of the power transistor. If too much charge accumulates within the gate dielectric of the power transistor, the gate dielectric can be irreversibly damaged.

Many different schemes have been proposed to reduce accumulated charge within the trapped charge. One scheme can include a double-gated power transistor, and another scheme can include one or more additional transistors within a pixel control circuit. Each can significantly complicate the fabrication and layout of the pixel control circuit, and may further reduce an already low aperture ratio (e.g., no greater than 30%).

Another scheme may not alter the pixel control circuit, but remove trapped charge by reverse biasing an OLED and relying on the parasitic resistance of the OLED when the OLED is reversed-bias. If there are any significant surface asperities in either electrode for the OLED, or if a particle is present between the electrodes, a region of relatively high electrical field may be generated when the OLED is reverse-biased. This region of relatively high electrical field can cause a premature failure of the OLED when the OLED is reverse biased (e.g., when removing trapped charge).

SUMMARY

An electronic device can include an organic diode and a shunt that allows a significant current to bypass the organic diode, wherein the shunt is separate from the organic diode. Alternatively, an electronic device can include an organic diode lying along a first conduction path. The electronic device can also include a resistive member lying along a second conduction path that is parallel to the first conduction path.

In another aspect, a process of forming an electronic device can include forming a first conductive member, forming a first resistive member over the first conductive member, and forming a first organic semiconductor layer over the first conductive member. The process can also include forming a second conductive member over the first resistive member and the first organic semiconductor layer, such that the first resistive member and the first organic semiconductor layer lie along parallel conduction paths between the first and second conductive members.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
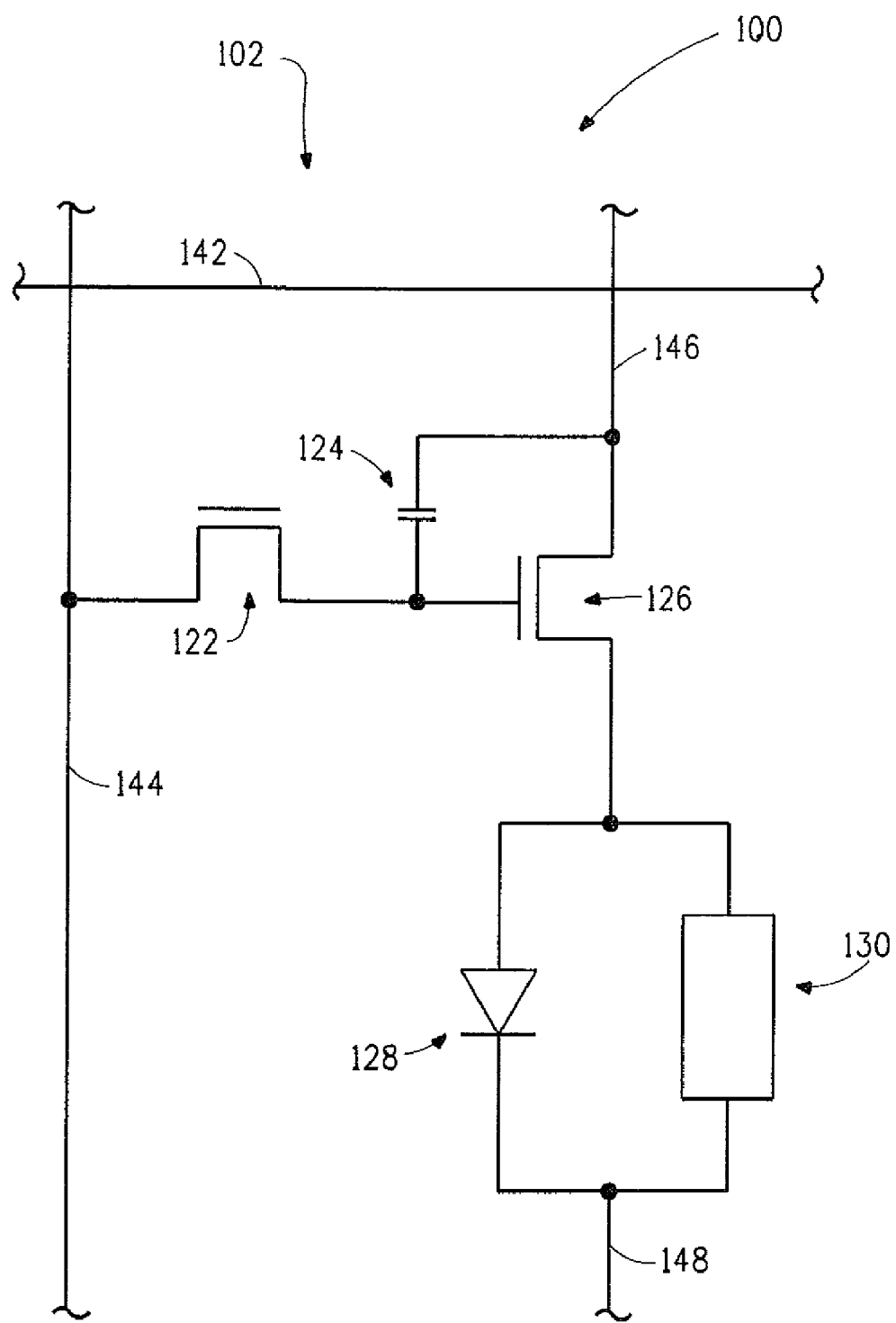
FIG. 1 includes a circuit schematic of a pixel within an electronic device including a display, wherein the pixel includes a shunt.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include an organic diode and a shunt that allows a significant current to bypass the organic diode, wherein the shunt is separate from the organic diode.

In an embodiment, a first terminal of the shunt is electrically connected to an anode of the organic diode, and a second terminal of the shunt is electrically connected to a cathode of the organic diode. In another embodiment, the shunt includes a resistive member. In a particular embodiment, the shunt further includes a first diode that is serially connected to the resistive member. In a more particular embodiment, an anode of the first diode is electrically connected to a cathode of the organic diode, a cathode of the first diode is electrically connected to a first terminal of the resistive member, and a second terminal of the resistive member is electrically connected to an anode of the organic diode.

In another particular embodiment, the shunt further includes a first diode and a second diode, wherein the second diode is characterized as having a significantly lower breakdown voltage than the first diode. In a more particular embodiment, within the shunt, cathodes of the first and second diodes are more directly coupled to each other than anodes of the first and second diodes. In a still more particular embodiment, the anode of the first diode is electrically coupled to a cathode of the organic diode, and the anode of the second diode is electrically coupled to an anode of the organic diode. In an even more particular embodiment, the resistive member includes a first terminal electrically connected to the cathode of the first diode, and a second terminal electrically connected to the cathode of the second diode.

In a further embodiment, a particle lies within an electrode of the organic diode or between an electrode and an organic semiconductor layer of the organic diode. In still a further embodiment, the organic diode has a characteristic forward-bias resistance, and the shunt has a characteristic shunt resistance that is in a range of approximately 100 to approximately 1000 times the forward-bias resistance.

In another aspect, an electronic device can include an organic diode lying along a first conduction path and a resistive member lying along a second conduction path that is parallel to the first conduction path.

In an embodiment of the other aspect, the electronic device further includes a first diode lying along the second conduction path. In a particular embodiment, the electronic device further includes a second diode lying along the second conduction path. In a more particular embodiment, the first and second diodes are configured such that when a current would flow along the second conduction path, the first diode would be forward biased and the second diode would be reversed biased. In another more particular embodiment, the resistive member, the first diode, and the second diode are serially connected in any combination along the second conduction path.

In a further aspect, a process of forming an electronic device can include forming a first conductive member, forming a first resistive member over the first conductive member, and forming a first organic semiconductor layer over the first conductive member. The process can also include forming a second conductive member over the first resistive member and the first organic semiconductor layer, such that the first resistive member and the first organic semiconductor layer lie along parallel conduction paths between the first and second conductive members.

In an embodiment of this further aspect, forming the first resistive member includes forming a first doped region of a semiconductor member, wherein the first doped region has a lower doping concentration than a second doped region and a third doped region that are immediately adjacent to and along opposite sides of the first doped region. In a particular embodiment, the first, second, and third doped regions have a same conductivity type. In another particular embodiment, the process further includes forming a first diode, wherein the third doped region has a conductivity type that is opposite that of the first doped region. In a more particular embodiment, the process further includes forming a second diode, wherein a fourth doped region lies adjacent to the second doped region, and wherein the fourth doped region has a conductivity type that is opposite that of the second doped region. In an even more particular embodiment, the first and second doped regions have a same conductivity type, and a dopant concentration of the first doped region is less than a dopant concentration of the second doped region.

In another embodiment of this further aspect, the process further includes forming a third conductive member, forming a second resistive member over the third conductive member, forming a second organic semiconductor layer over the third conductive member, and forming a fourth conductive member over the second resistive member and the second organic semiconductor layer, such that the second resistive member and the second organic semiconductor layer lie along parallel conduction paths between the third and fourth conductive members. The process also includes forming a fifth conductive member, forming a third resistive member over the third conductive member, forming a third organic semiconductor layer over the fifth conductive member, wherein the first, second and third organic semiconductor layers are part of red, green, and blue light-emitting pixels, and forming a sixth conductive member over the third resistive member and the third organic semiconductor layer, such that the third resistive member and the third organic semiconductor layer lie along parallel conduction paths between the fifth and sixth conductive members. In a particular embodiment, the first, third, and fifth conductive members are part of a first common electrode, or the second, fourth, and sixth conductive members are part of a second common electrode. In another particular embodiment, the first, second and third resistive members are formed substantially simultaneously, and the first, second, and third organic semiconductor layers are formed at different times as compared to one another.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by Pixel Including a Shunt, Exemplary Physical Structures for the Shunt, Fabrication of the Electronic Device, Operation of the Electronic Device, Alternative Embodiments, and finally Benefits.

1. Definitions and Clarification of Terms

Before addressing details of embodiments described below, some terms are defined or clarified.

The term "charge-blocking," when referring to a layer, material, member, or structure, is intended to mean such layer, material, member or structure reduces the likelihood that a charge migrates into another layer, material, member or structure. A charge-blocking layer can include an electron-blocking layer or a hole-blocking layer.

The term "charge-injection," when referring to a layer, material, member, or structure, is intended to mean such layer, material, member or structure promotes charge migration into an adjacent layer, material, member or structure. A charge-injection layer can include an electron-injection layer or a hole-injection layer.

The term "charge-transport," when referring to a layer, material, member, or structure is intended to mean such layer, material, member, or structure facilitates migration of such charge through the thickness of such layer, material, member, or structure with relative efficiency and small loss of charge. A charge-transport layer can include an electron-transport layer or a hole-transport layer.

The term "containment structure" is intended to mean a structure within or over a workpiece, wherein such one or more structures, by itself or collectively, serve a principal function of constraining or guiding a material within an area or region as it flows over the workpiece. A containment structure can include cathode separators or a well structure.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors electrically connected to different electronic components where a capacitor between the conductors is unintended or incidental).

The term "electronic device" is intended to mean a collection of circuits, electronic components, or any combination thereof that collectively, when properly electrically connected and supplied with the appropriate potential(s), performs a function. An electronic device may be included or be part of a system. An example of an electronic device includes a display, a sensor array, a computer system, an avionics system, an automobile, a cellular phone, other consumer or industrial electronic product, or any combination thereof.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to mean a liquid within a solution, dispersion, suspension, or emulsion. The term "liquid medium" is used regardless whether one or more solvents are present, and therefore, liquid medium is used as the singular or plural form (i.e., liquid media) of the term.

The term "organic layer" is intended to mean one or more layers, wherein at least one of the layers comprises a material including carbon and at least one other element, such as hydrogen, oxygen, nitrogen, fluorine, etc.

The term "organic semiconductor layer" is intended to mean one or more organic layers, wherein at least one of the organic layers, by itself, or when in contact with a dissimilar material is capable of forming a rectifying junction.

The term "pn diode" is intended to mean a diode having a characteristic breakdown by an avalanche breakdown mechanism.

The term "printing" is intended to mean an act of selectively depositing a layer by using a printing head or other similar structure to dispense a liquid or liquid composition onto a workpiece.

The term "power supply line" is intended to mean a conductor having a primary function of transmitting power. A power supply line can include a $V_{DD}$ line or a $V_{SS}$ line.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting component, such as a light-emitting diode, is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or within a semiconductor region or a junction formed by an interface between a semiconductor layer or a semiconductor region and a dissimilar material, in which charge carriers of one type flow easier in one direction through the junction compared to the opposite direction. A pn junction is an example of a rectifying junction that can be used as a diode.

The term "signal line" is intended to mean a line over which one or more signals may be transmitted. The signal transmitted may be substantially constant or vary with time. A signal line can include a control line, a data line, a scan lines, a select lines, a power supply line, or the like. Note that a signal line may serve one or more principal functions.

The term "Zener diode" is intended to mean a diode having a characteristic breakdown by a Zener breakdown mechanism (e.g., breakdown of 6 volts or less in silicon).

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Pixel Including a Shunt

FIG. 1 includes a circuit diagram of a portion of an array within an electronic device 100 including a pixel 102. Although not illustrated, other pixels can be present within the electronic device. The pixels can be part of a pixel array for a display (monochromatic or full color), a sensor array, a photovoltaic array, or the like. In an embodiment, the pixel 102 can be a sub-pixel. For the purposes of this specification, the term pixel will be used although skilled artisans will appreciate that the concepts described herein can be extended to sub-pixels within pixels. As illustrated in FIG. 1, the pixel 102 includes a pixel control circuit that includes a select transistor 122, a storage capacitor 124, and a power transistor 126, and is used to control an electronic component 128 during normal operation of the electronic device. In one embodiment, the electronic component 128 is a radiation-emitting component, and in another embodiment, the electronic component 128 is a radiation-responsive component. The pixel 102 also includes a shunt 130 that is connected in parallel with the electronic component 128. The shunt 130 is described later in this section.

A gate electrode of the select transistor 122 is connected to a select line 142. In one embodiment, the select lines 142 are activated as a function of time, and therefore, each select line 142 can be a scan line. A first source/drain region of select transistor 122 is connected to a data line 144. A second source/drain region of the select transistor 122, a first electrode of the storage capacitor 124, and the gate electrode of the power transistor 126 are connected to one another. A first source/drain region of the power transistor 126 is connected to an anode of the electronic component 128.

A second electrode of the storage capacitor 124 and a second source/drain region of the power transistor 126 are connected to a first signal line 146. A cathode of the electronic components 128 is connected to a second signal line 148. When the electronic component 128 is a radiation-emitting component, and the display is displaying information, the first signal line can be electrically connected to a $V_{DD}$ terminal of the electronic device 100, and the second signal line can be electrically connected to a $V_{SS}$ terminal of the electronic device 100. When the electronic component 128 is a radiation-emitting component, and trapped charge is being removed from the gate dielectric of the power transistor 126, the second signal line 148 can be at a voltage higher than the gate electrode of the power transistor 126, and the first signal line 146 can float or be electrically connected to a $V_{SS}$ terminal of the electronic device 100. After reading this specification, skilled artisans will appreciate that the array may include nearly any finite number of pixels having a circuit similar to the one illustrated in FIG. 1.

When the electronic component 128 is reverse biased, the shunt 130 can provide a conduction path so that the electronic component 128 is not stressed or not stressed to the same level, as if the shunt 130 would not be present. In a particular embodiment, the electronic component 128 includes an organic diode. In a particular embodiment, the electronic component 128 is a radiation-emitting component. Over time, charge can become trapped within the gate dielectric of the power transistor 126. In a particular embodiment, the shunt 130 may provide a conduction path when trapped charge is to be removed from the gate dielectric of the power transistor 126. The shunt 130 can include a passive electronic component, such as a resistive member, a diode, an inductor, or any combination thereof.

The shunt 130 is separate from the electronic component 128, and therefore, is not a parasitic component (e.g., parasitic resistor, parasitic capacitor, or the like) of the electronic component 128.

Figure 2:
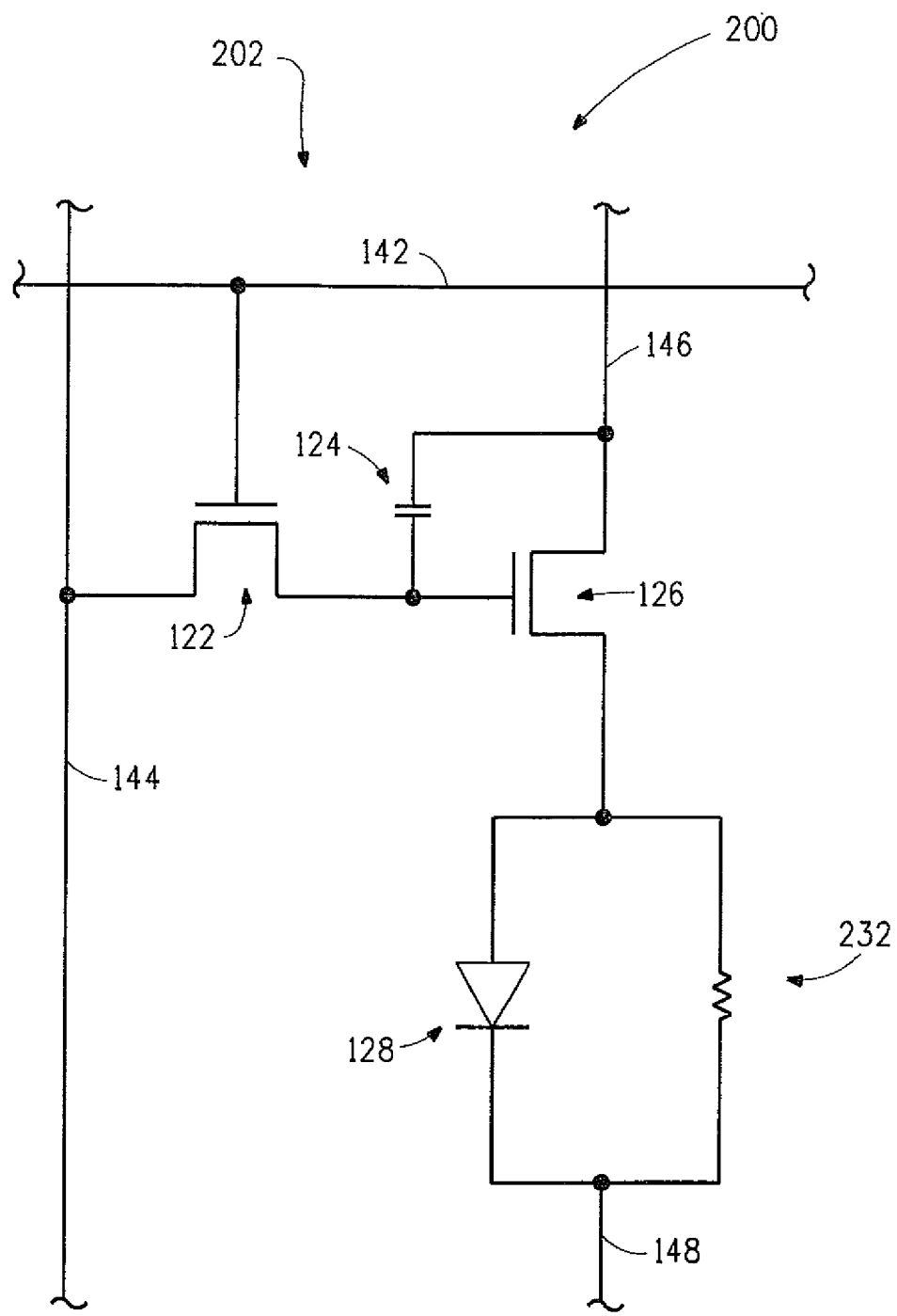
FIGS. 2 to 5 include circuit schematics of pixels that include alternative electronic components that can be used as the shunt in FIG. 1.

FIG. 2 includes a circuit diagram of a portion of an array within an electronic device 200 including a pixel 202. In the embodiment as illustrated in FIG. 2, the shunt includes a resistive member 232, and in a particular embodiment, terminals of the resistive member 232 are electrically connected to the anode and cathode of the electronic component 128. The resistive member 232 can have a resistance less than the resistance of the electronic component 128 when reversed-biased (before reaching a breakdown voltage of the electronic component 128). In another embodiment, the resistive member 232 can have a resistance higher than the resistance of the electronic component 128 when forward-biased. In a particular embodiment, the resistive member 232 can have a resistance that is 100 times to 1000 times higher than the resistance of the electronic component 128 when forward-biased. In this particular embodiment, when the electronic component 128 is forward biased, 99% to 99.9% of the current flows through the electronic component 128, and 0.1% to 1% of the current flows through the resistive member 232. If the electronic component 128 has a rectification ratio (reverse-biased resistance to the forward-biased resistance) of $1 \times 10^6$, when the electronic component 128 is reversed biased, 0.1% to 1% of the current flows through the electronic component 128, and 99% to 99.9% of the current flows through the resistive element 232. The numbers given are merely to illustrate and do not limit the present invention. After reading this specification, skilled artisans will be capable of determining the resistance of the resistive member 232 for the particular characteristics of the electronic component 128.

Figure 3:
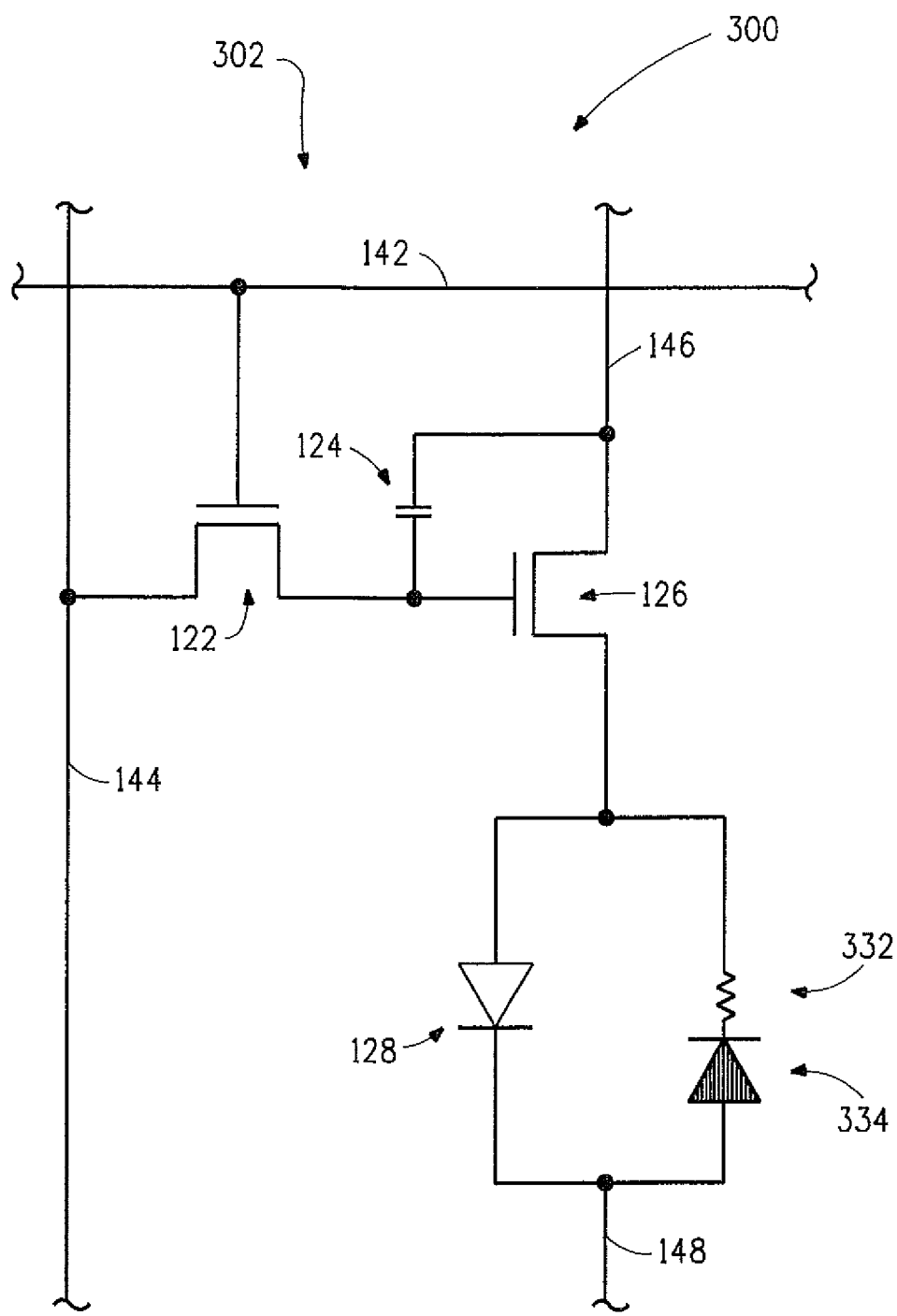

FIG. 3 includes a circuit diagram of a portion of an array within an electronic device 300 including a pixel 302. In the embodiment as illustrated in FIG. 3, the shunt includes a resistive member 332 and a diode 334 that are serially connected. The diode 334 can help to reduce current flow through the shunt when the electronic component 128 is forward biased. The diode 334 can be a pn diode, a Zener diode (not illustrated), or the like. The resistance of the resistive member 332 can be the same or different from the resistive member 232. In a particular embodiment, an anode of the diode 334 is electrically connected to the cathode of the electronic component 128, a cathode of the diode 334 is electrically connected to a terminal of the resistive member 332, and another terminal of the resistive member 332 is electrically connected to the anode of the electronic component 128. In another embodiment, the positions of the resistive member 332 and the diode 334 within the shunt are reversed; the cathode of the diode 334 is electrically connected to the anode of the electronic component 128, the anode of the diode 334 is electrically connected to a terminal of the resistive member 332, and another terminal of the resistive member 332 is electrically connected to the cathode of the electronic component 128.

Figure 4:
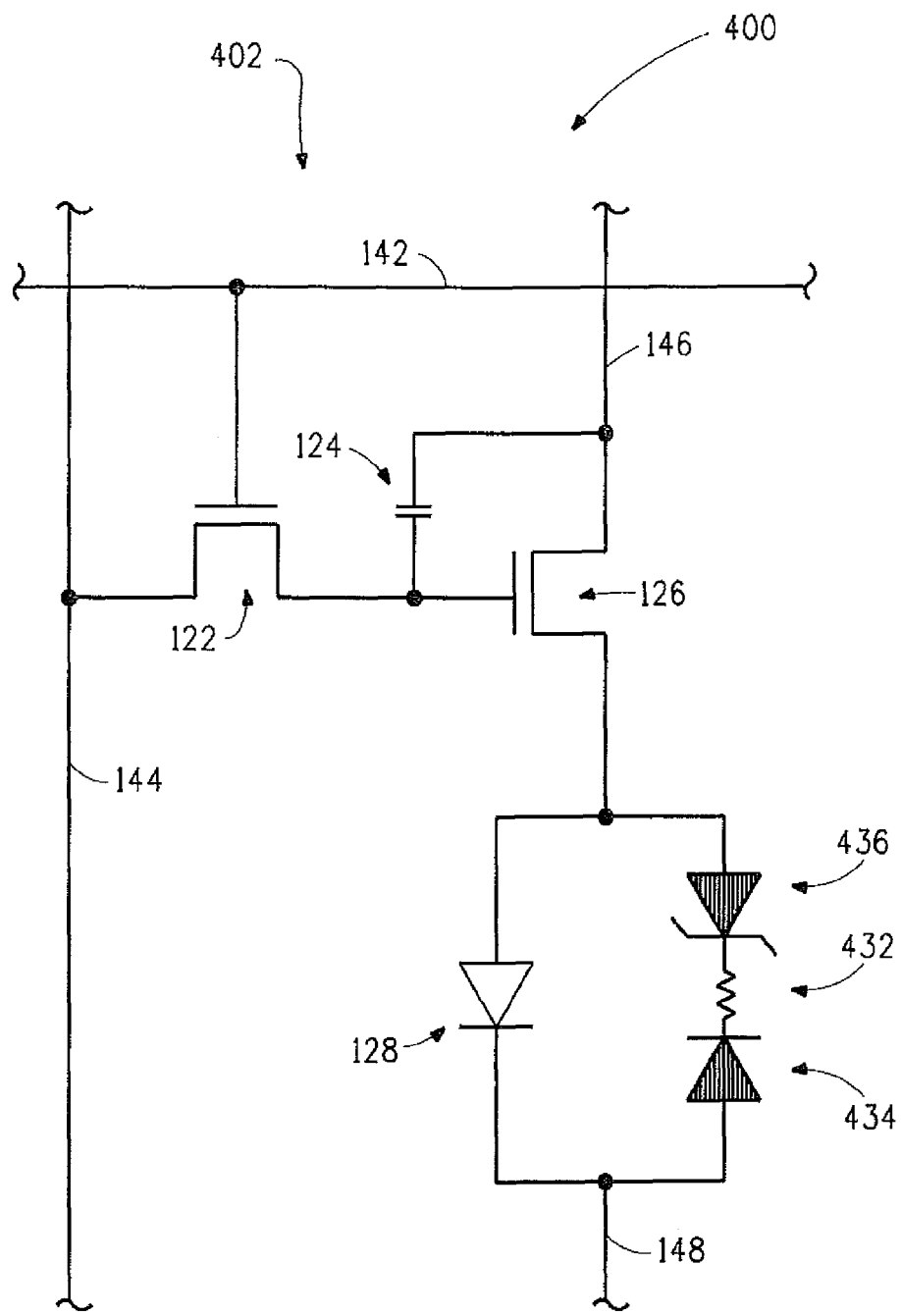

FIG. 4 includes a circuit diagram of a portion of an array within an electronic device 400 including a pixel 402. In the embodiment as illustrated in FIG. 4, the shunt includes a resistive member 432 and a diode 434, and another diode 436. The passive electronic components within the shunt can be serially connected in any order. The diode 434 can be any of the diodes described with respect to the diode 334 and serve substantially the same purpose as the diode 334. The resistance of the resistive member 432 can be the same or different from the resistive member 232.

The diode 436 can be a Zener diode, a pn diode (not illustrated), or the like. The diode 436 can have a breakdown voltage that is significantly lower than the breakdown voltage of the electronic component 128 to help protect the electronic component 128 from experiencing a potential damaging voltage difference between the anode and cathode of the electronic component 128. In an embodiment, the diode can have a breakdown voltage that is significantly lower than the diode 434. In a particular embodiment, the diode 436 has a breakdown voltage no greater than 12 volts, in another particular embodiment, the diode 436 has a breakdown voltage no greater than 10 volts, and in still another particular embodiment, the diode 436 has a breakdown voltage no greater than 6 volts.

The passive components within the shunt can be serially connected in any order. In a particular embodiment, an anode of the diode 434 is electrically connected to the cathode of the electronic component 128, a cathode of the diode 434 is electrically connected to a terminal of the resistive member 432, another terminal of the resistive member 432 is electrically connected to a cathode of the diode 436, an anode of the diode 436 is electrically connected to an anode of the electronic component 128. In this particular embodiment, within the shunt, the cathodes of the diodes 434 and 436 are more directly coupled to each other than anodes of the diodes 434 and 436, and in another particular embodiment, within the shunt, the anodes of the diodes 434 and 436 are more directly coupled to each other than cathodes of the diodes 434 and 436.

Figure 5:
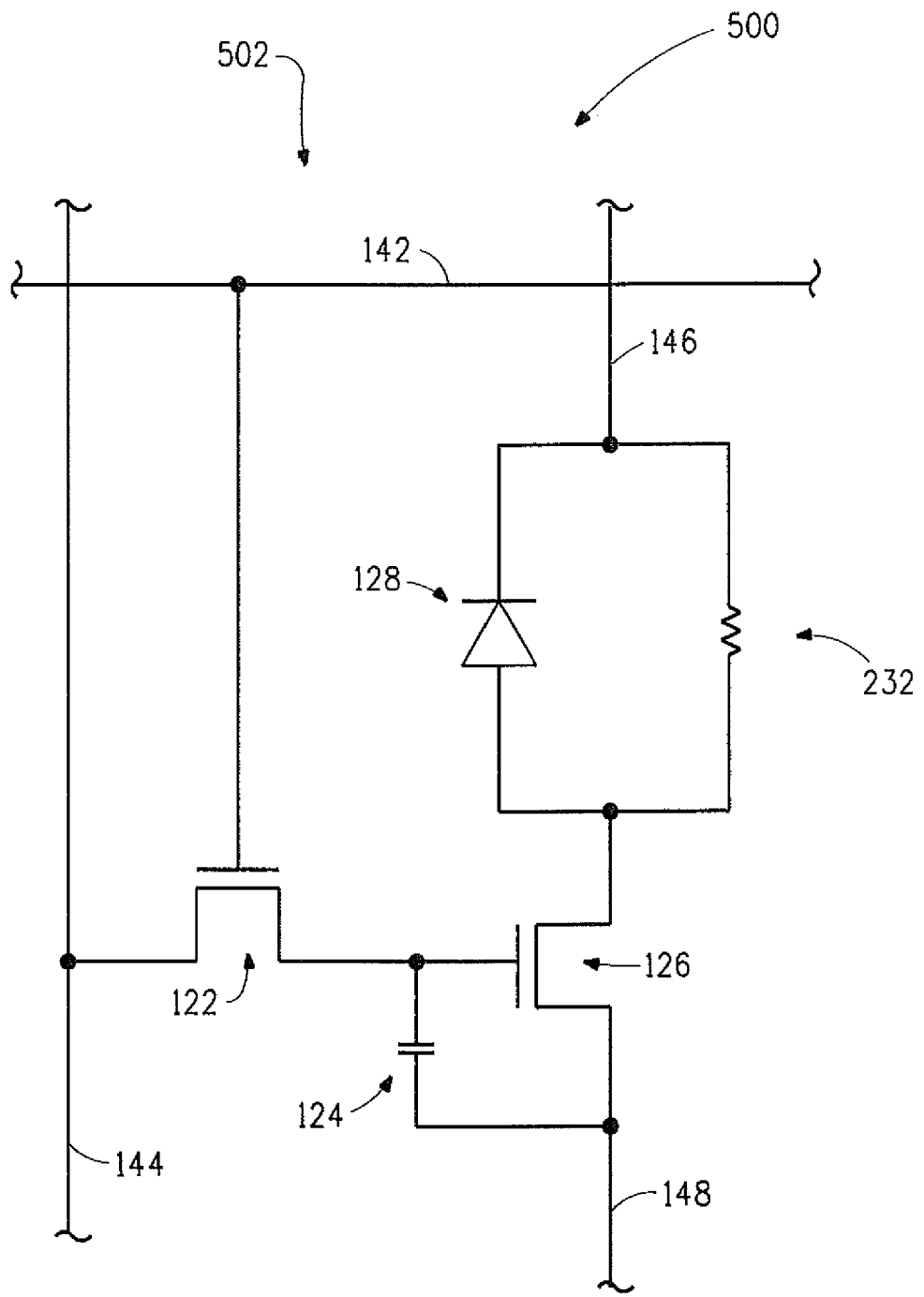

FIG. 5 includes a circuit diagram of a portion of an array within an electronic device 300 including a pixel 502. In the embodiment as illustrated in FIG. 5, the positions of the power transistor 126 and the combination of the electronic component 128 and resistive member 232 are reversed as compared to the embodiment as described with respect to FIG. 2. The anode of the electronic component 128 and a terminal of the resistive member 232 may be connected to the first signal line 146, and a cathode of the electronic component 128 and the other terminal of the resistive member 232 may be connected to a source/drain region of the power transistor 126. The other source/drain region of the power transistor 126 may be connected to the second signal line 148. Although not illustrated, circuits illustrated and described with respect to FIGS. 3 and 4 can be modified in a similar manner as described with respect to FIGS. 2 and 5.

In another embodiment, different shunt circuits may be used for different pixels within a pixel array. For example, red light-emitting components may use one type of shunt circuit, green light-emitting components may use a different type of shunt circuit, and blue light-emitting components may use another type of shunt circuit that is different from the shunt circuits for the red and green light-emitting components. After reading this specification, skilled artisans will be able to select components and circuit designs for shunt circuits that meet their needs or desires for their particular applications.

3. Exemplary Physical Structures for the Shunt

Many different physical structures can be used for the shunt. The shunt can include an organic material, an inorganic material, or any combination thereof. The physical structures presented herein are merely to illustrate just some of the possible physical structures, and many more are possible without deviating from the concepts described herein.

Figure 6:
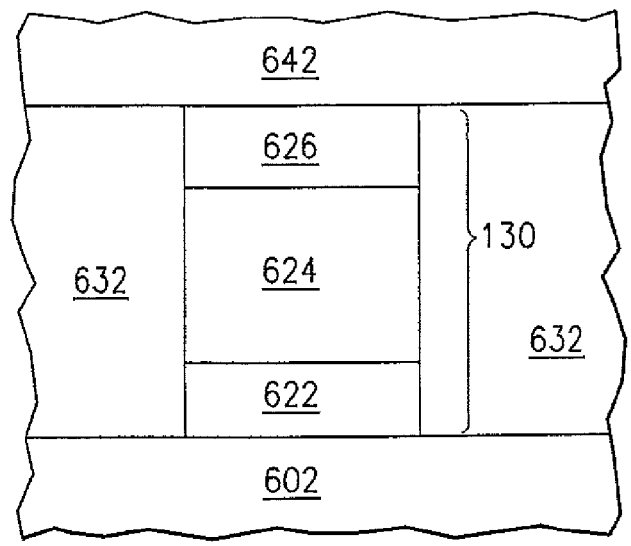
FIGS. 6 to 8 include illustrations of cross-sectional views of portions of workpieces that include exemplary physical structures that can be used for the shunt in FIG. 1.

FIG. 6 includes an illustration of a cross-sectional view of a portion of a workpiece that includes a physical structure for the shunt 130, which in this particular embodiment is similar to the resistive member 232 in FIG. 2. A conductive member 602 may be part of or electrically connected to the anode for the electronic component 128 (not illustrated in FIG. 6). More details regarding the conductive member 602 are described in more detail later in this specification.

Doped regions 622 and 626 can include a semiconductor material having a dopant concentration of at least $1 \times 10^{19}$ atoms/cm$^3$, so that ohmic contacts are formed between the shunt 130 and the conductive members 602 and 642. A resistive region 624 can also be a semiconductor material and have a dopant concentration less than the doped regions 622 and 624. In an embodiment, the dopant concentration can be at least $1 \times 10^{12}$ atoms/cm$^3$, $1 \times 10^{13}$ atoms/cm$^3$, or $1 \times 10^{14}$ atoms/cm$^3$, and in another embodiment, the dopant concentration is no greater than $5 \times 10^{18}$ atoms/cm$^3$, $1 \times 10^{18}$ atoms/cm$^3$, or $5 \times 10^{17}$ atoms/cm$^3$. In a particular embodiment, the dopant concentration of the resistive region 624 is in a range of approximately $5 \times 10E^{14}$ atoms/cm$^3$ to $1 \times 10^{17}$ atoms/cm$^3$. The doped regions 622, 624, and 626 have the same conductivity type (i.e., all n-type doped or all p-type doped), although different doping species can be used.

Attention is now directed to formation of the shunt 130, as illustrated in FIG. 6. After forming the conductive member 602, a lower semiconductor layer that will be used in forming the doped region 622 can be formed over the workpiece. In an embodiment, the thickness of the lower semiconductor layer is at least 0.1 μm, 0.2 μm, or 0.3 μm, and in another embodiment, the thickness of the lower semiconductor layer is no greater than 5 μm, 3 μm, or 1 μm. In a particular embodiment, the thickness is in a range of approximately 0.3 to 1.0 μm.

In an embodiment, the lower semiconductor layer can be deposited as an undoped semiconductor layer and then be subsequently doped using ion implantation or furnace doping. The semiconductor layer can include amorphous or polycrystalline silicon, germanium, or other semiconductor material. When ion implantation is used, $P^+_{31}$, $As^+_{75}$, or the like can be implanted into the undoped semiconductor layer for an n-type doped region, or $B^+_{11}$ or $BF_2^+$ or the like can be implanted for a p-type doped region. When furnace doping is used, a doping source can include $POCl_3$, $PH_3$, $AsH_3$, or the like for an n-type doping source, or $B_2H_6$, BN, or the like for a p-type doping source. Alternatively, the lower semiconductor layer can be deposited as an in-situ doped semiconductor layer. A dopant gas, such as $PH_3$, $AsH_3$, or the like can be used for an n-type doping source, or $B_2H_6$ can be used for p-type doping source.

A middle semiconductor layer can be formed over the lower semiconductor layer. The middle semiconductor layer can be used to form the resistive region 624. The middle semiconductor layer can be formed using any of the formation techniques as described with respect to the lower semiconductor layer. The materials and thicknesses for the middle semiconductor layer can be the same or different from the materials and thicknesses for the lower semiconductor layer. In a particular embodiment, the middle semiconductor layer is thicker than each of the lower semiconductor layer and the subsequently-formed upper semiconductor layer. The middle semiconductor layer and the lower semiconductor layer can be formed using the same or different formation techniques. The dopant concentration of the middle semiconductor layer is less than the dopant concentration of the lower semiconductor layer, and therefore, the dose, dopant gas flow rate, or doping temperature may be adjusted to give the needed or desired dopant concentration.

An upper semiconductor layer can be formed over the middle semiconductor layer. The upper semiconductor layer can be used to form the doped region 626. The upper semiconductor layer can have any of the materials and thicknesses for the lower semiconductor layer and be formed using any of the formation techniques as described with respect to the lower semiconductor layer. The upper semiconductor layer and the lower semiconductor layer can have the same or different materials or thicknesses and be formed using the same or different formation techniques.

In an alternative embodiment, any combination of the lower, middle, and upper semiconductor layers can be formed as a single layer. In this particular embodiment, the single layer can be formed as an in-situ doped semiconductor layer, wherein the dopant gas flow rates are relatively higher when forming the portions for the doped regions 622 and 626 than when forming the resistive region 624.

After the single semiconductor layer or a plurality of semiconductor layers is formed, it is patterned to form the shunt 130, which in this particular embodiment includes a resistive member. The resistance of the resistive member may be principally determined by resistivity and shape of the resistive region 624. After reading this specification, skilled artisans will understand how to determine the resistivity and shape to achieve the desired resistance of the resistive member.

After the shunt 130 has been formed, a patterned insulating layer 632 is formed over the conductive member 602 and laterally surrounding the shunt 130. In one embodiment, the patterned insulating layer 632 can include an organic material, an inorganic material, or any combination thereof. In a particular embodiment, the patterned insulating layer 632 can be a containment structure, such as a well structure. The height of the shunt 130 (e.g., combined thickness of the doped regions 622 and 626 and the resistive region 624) can be substantially the same as the thickness used for the containment structure. In an embodiment, the thickness can be at least approximately 0.1 µm, 0.3 µm, or 0.5 µm, and in another embodiment, the thickness may be no greater than approximately 9 µm, 7 µm, or 5 µm. In a particular embodiment, the thickness can be in a range of approximately 1 µm to approximately 5 µm.

The patterned insulating layer 632 can be formed by depositing (e.g., coating, chemical vapor deposition, physical vapor deposition, or the like) over the workpiece and using a polishing or etch-back technique to expose the doped region 626. Other or additional processing operations may be performed for other electronic components or for other reasons.

Another conductive member 642 may be part of or electrically connected to the cathode for the electronic component 128 (not illustrated in FIG. 6). More details regarding the conductive member 642 are described in more detail later in this specification. Thus, the shunt 130 can include a resistive member that is connected in parallel with the organic electronic component 128.

Figure 7:
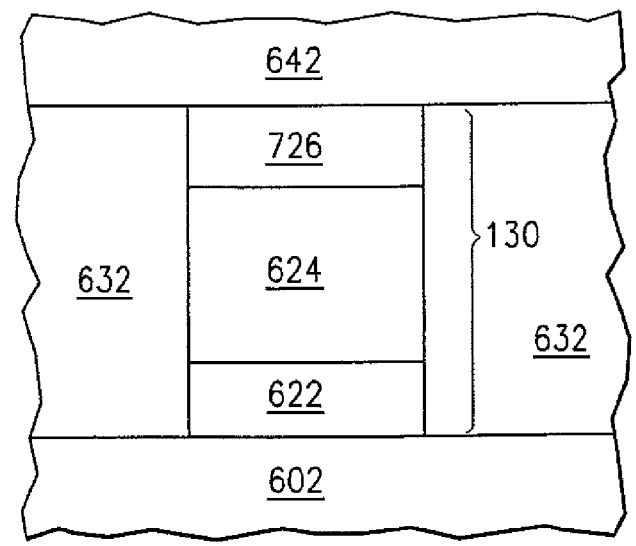

FIG. 7 illustrates another embodiment in which the shunt 130 includes a diode and a resistive member connected in series, similar to the diode 334 and the resistive member 332 in FIG. 3. Much of the physical structure is similar to the physical structure in FIG. 6. Unlike the physical structure in FIG. 6, the doped region 726 has an opposite conductivity type compared to the resistive region 624. In an embodiment, the doped region 726 is p-type doped, and the doped region 622 and the resistive region 624 are n-type doped. The breakdown voltage formed by the junction of the resistive region 624 and doped region 726 may be determined mostly by the dopant concentration within the resistive region 624. In an embodiment, the dopant concentration of the resistive region 624 may be no greater than $1\times10^{17}$ atoms/cm$^3$, $5\times10^{16}$ atoms/cm$^3$, or $1\times10^{16}$ atoms/cm$^3$. In a particular embodiment, the diode formed by the combination of the resistive region 624 and the doped region 726 can be a pn diode that has an associated avalanche breakdown voltage but is not a Zener diode (e.g., a diode having a breakdown voltage less than 6 volts). The materials (other than dopant), dopant concentration, thickness, and formation of the doped region 726 can be any of those described with respect to the doped region 622. The other (non-dopant) materials, dopant concentration, thickness, and formation technique for the doped region 726 may be the same as or different from the doped region 622.

The patterned insulating layer 632 and the conductive member 642 can be formed as previously described. Other or additional processing operations may be performed for other electronic components or for other reasons. Thus, the shunt 130 can include a resistive member and a diode that are serially connected to one another, wherein the shunt 130 is connected in parallel with the organic electronic component 128.

Figure 8:
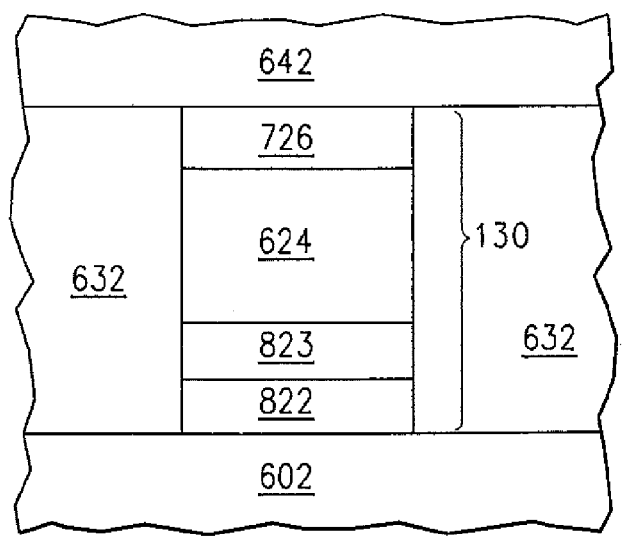

FIG. 8 illustrates another embodiment in which the shunt 130 includes diodes and a resistive member connected in series, similar to the diode 434, the resistive member 432, and the diode 436 in FIG. 4. The physical structure includes doped regions 822, 823, and 726 and the resistive region 624. The doped regions 822 and 726 have one conductivity type, and the region 823 and the resistive region 624 can have the opposite conductivity type. In one embodiment, the doped regions 822 and 726 are p-type doped, and the doped region 622 and the resistive region 624 are n-type doped. The junction of the resistive region 624 and doped region 726 forms a diode, as previously described with respect to FIG. 7. The resistance of the shunt 130 will be principally determined by the resistivity and shape of the resistive region 624.

The materials, dopant concentration, thickness, and formation of the doped region 822 can be any of those described with respect to the doped region 726. The materials, dopant concentration, thickness, and formation technique for the doped region 822 may be the same as or different from the doped region 726.

The other diode is formed by the junction of the doped regions 822 and 823. Similar to the diode formed by the junction of the resistive region 624 and the doped region 724, the breakdown voltage of the other diode can be principally determined by the doping concentration of the doped region 823. The dopant concentration of the doped region 823 can be tailored to achieve a breakdown voltage needed or desired to adequately protect the electronic component 128. For example, if the electronic component 128 is not to be reverse biased at more than 12 volts, the breakdown voltage of the other diode can be 12 volts or less. In another embodiment, the breakdown voltage of the other diode may be no greater than 9 volts, 6 volts, or lower. The other diode can be a pn diode or a Zener diode. A relatively higher dopant concentration produces a relatively lower breakdown voltage, and a relatively lower dopant concentrative produces a relatively higher breakdown voltage. The doping concentration of the doped region 823 can be less than each of the dopant concentrations of the doped regions 822 and 726 and can be more than the dopant concentration of the resistive region 624. In an embodiment, the dopant concentration of the doped region 823 can be at least $1\times10^{16}$ atoms/cm$^3$, $3\times10^{16}$ atoms/cm$^3$, or $5\times10^{16}$ atoms/cm$^3$, and in another embodiment, the dopant concentration is no greater than $5\times10^{18}$ atoms/cm$^3$, $1\times10^{18}$ atoms/cm$^3$, or $5\times10^{17}$ atoms/cm$^3$. In a particular embodiment, the dopant concentration of the doped region 823 is in a range of approximately $5\times10E^{16}$ atoms/cm$^3$ to $1\times10^{17}$ atoms/cm$^3$. In another embodiment, a different dopant concentration for the doped region 823 can be used.

The materials, thickness, and formation of the doped region 823 can be any of those described with respect to the doped region 622. The materials, thickness, and formation technique for the doped region 823 may be the same as or different from the doped region 622.

The patterned insulating layer 632 and the conductive member 642 can be formed as previously described. Other or additional processing operations may be performed for other electronic components or for other reasons. Thus, the shunt 130 can include a resistive member and diodes that are serially connected, wherein the shunt 130 is connected in parallel with the organic electronic component 128.

Other physical structures can be used for the shunt 130 but are not illustrated. For example, the shunt 130 can be formed when any one or more of the electronic components within the pixel control circuits (e.g., the select transistor 122, the capacitor 124, the power transistor 126, or any combination thereof) are being formed. Contacts can be subsequently made that connect the anode and cathode of the electronic component 128 to the terminals of the shunt 130. In another embodiment, the shunt may be formed over the conductive member 642. An insulating layer (not illustrated) can be formed over the conductive member 642, contacts can be formed to the conductive members 602 and 642, and the shunt can be formed over the insulating layer, such that the terminals of the shunt 130 are electrically connected to the conductive members 602 and 642. After reading this specification, skilled artisans will appreciate that still other physical structures for the can be formed.

3. Fabrication of the Electronic Device

The fabrication process described herein can be used in an electronic device that include a pixel, such as any of the electronic devices, pixels, or portions thereof as described in FIGS. 1 to 8. Many alternative layouts, fabrication processes, and materials can be used. After reading this specification, skilled artisans will appreciate that a particular layout, fabrication process, and materials can be tailored to their needs or desires for a particular application.

Figure 9:
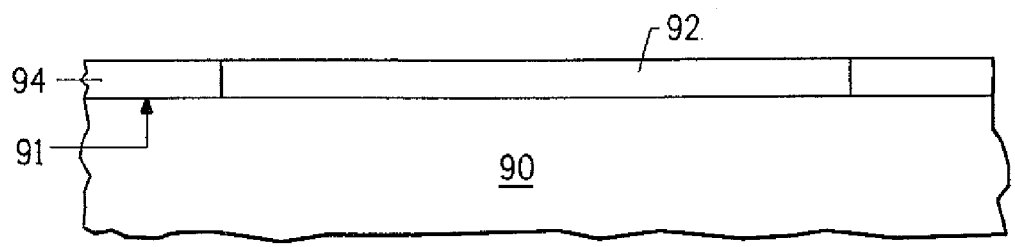
FIG. 9 includes an illustration of a cross-sectional view of a portion of a workpiece after forming an electrode over a substrate.

FIG. 9 includes a top view of a partially fabricated electronic device that includes a substrate 90. The substrate 20 can be a conventional substrate as used in the electronic device arts. The substrate 20 can be flexible or rigid, organic or inorganic. Generally, glass or flexible organic films are used. The substrate 20 can also include the pixel control circuits (not illustrated in FIG. 9). A source/drain region of the power transistor 126 may extend to or be electrically connected to a conductive member that extends to the primary surface 91 of the substrate 90. Other circuits that are outside the array may include peripheral or remote circuitry used to control one or more of the pixels within the array. The focus of fabrication is on the pixel array rather than the peripheral or remote circuitry.

An electrode 92 is formed over the primary surface 91 of the substrate 90. The electrode 92 can be electrically connected to the source/drain region of the power transistor 126. In one embodiment, the electrode 92 can be an anode for the electronic component 128 being formed. Other electrodes, substantially identical to the electrode 92, may be formed for other pixels within the electronic device. The electrode 92 can include a high work function material (work function greater than 4.4 eV). The electrode 92 can include one or more of layers of indium tin oxide, aluminum tin oxide, or other materials conventionally used for anodes within OLEDs. In an embodiment, the electrode 92 can transmit at least 70% of the radiation to be emitted from or responded to by subsequently formed organic semiconductor layer(s), region(s), or any combination thereof. In a particular embodiment, the thickness of the electrode 92 is in a range of approximately 100 to 200 nm. If radiation does not need to be transmitted through the electrode 92, the electrode 92 can be substantially opaque to visible light and can include aluminum, chromium, gold, silver, copper, or the like. The thickness may be greater, such as up to 1000 nm or even thicker. The electrode 92, whether or not it is to transmit radiation, can include a single film or a plurality of films. The composition of the electrode 92 along the uppermost surface can determine the work function for the electrode 92 in the electronic components 128. The electrode 92 can be formed using conventional or proprietary deposition and patterning techniques.

An insulating layer 94 can be formed if needed or desired. The insulating layer 94 can include an organic or inorganic material. In an embodiment, the insulating layer 94 includes an oxide, a nitride, an oxynitride, or any combination thereof. The insulating layer 94 can include a single film or a plurality of films. The insulating layer 94 may have a thickness that is thinner, thicker, or approximately the same as the thickness of the electrode 92. Any portion of the insulating layer 94 overlying the electrode 92 can be removed. The insulating layer 94 can be formed using conventional or proprietary deposition and patterning techniques. In another embodiment (not illustrated), the insulating layer 94 is not used.

Figure 10:
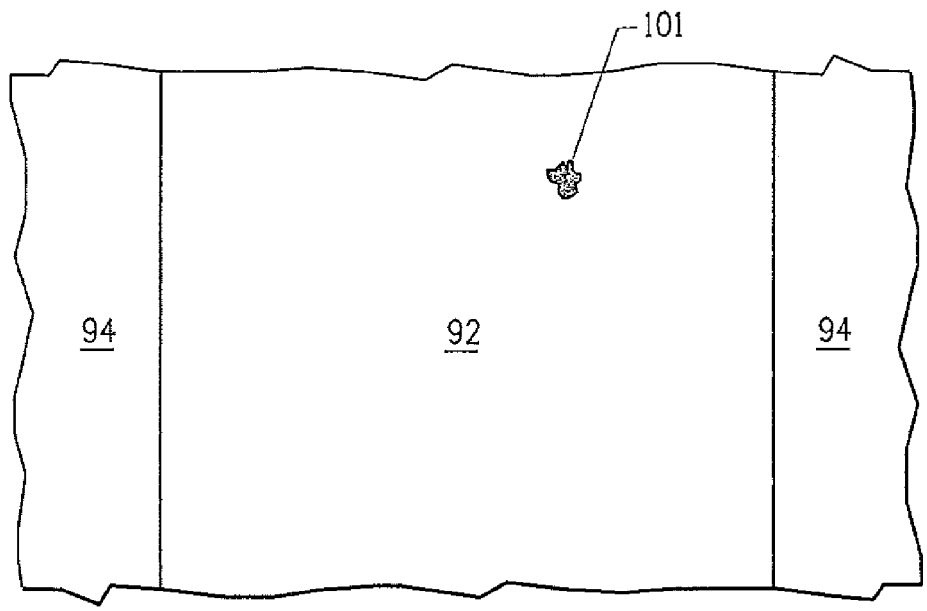
FIG. 10 includes an illustration of a top view of the workpiece of FIG. 9 to illustrate a defect within or on the electrode.

FIG. 10 includes a top view of the electrode 92 and the insulating layer 94. A defect 101 may lie within or on the electrode 92. The defect 101 may or may not be visible to the human eye or when using an optical microscope. The defect 101 can include a surface asperity along an exposed surface of the electrode 92 or can include a particle within or on top of the electrode 92. In another embodiment, the defect 101 can be within or between any layers that are part of the electronic component 128. While the defect 101 is undesired, completely eliminating all sources of defects may be nearly impossible.

Figure 11:
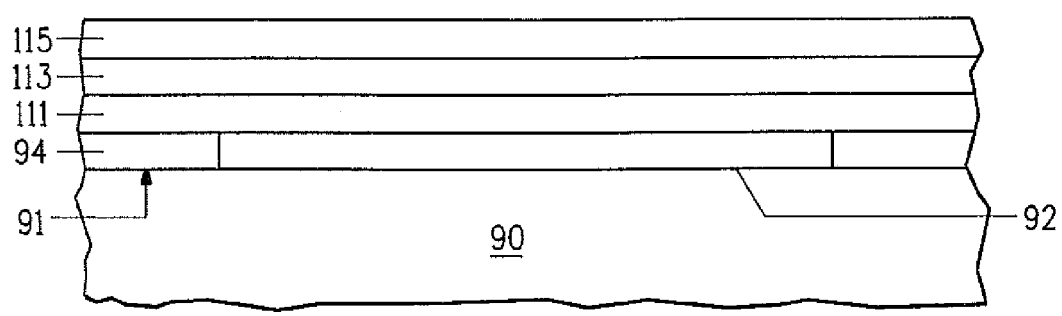
FIG. 11 includes an illustration of a cross-sectional view of the workpiece of FIG. 9 after forming layers for a shunt.

FIG. 11 includes a cross-sectional view of the partially fabricated electronic device after forming layers 111, 113, and 115 for the shunt 130. In the particular embodiment as illustrated in FIG. 11, the shunt 130 will include the diode-resistive member combination, as described with respect to the circuit as illustrated in FIG. 3 and the physical structure as illustrated in FIG. 7. The layers 111, 113, and 115 in FIG. 11 correspond to the layers that form the doped region 622, the resistive region 624, and the doped region 726, respectively in FIG. 7. An anneal may be performed after forming or doping the layer 111, 113, 115, or any combination thereof.

Figure 12:
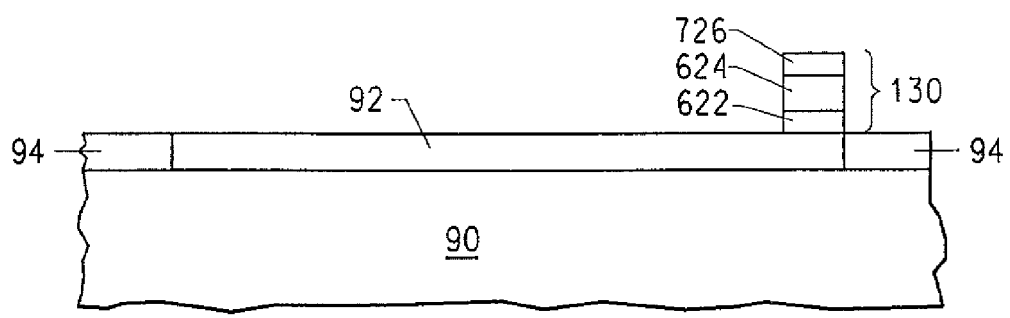
FIG. 12 includes an illustration of a cross-sectional view of the workpiece of FIG. 11 after patterning the layers to form the shunt.

FIG. 12 includes a cross-sectional view of the workpiece after the layers 111, 113, and 115 have been patterned to form the shunt 130. The shunt includes the doped regions 622 and 726, and the resistive region 624. Other shunts, substantially identical to or different from the shunt 130, may be formed for other pixels within the electronic device. The patterning of the layers 111, 113, and 115 can be performed using a conventional or proprietary patterning technique.

Figure 13:
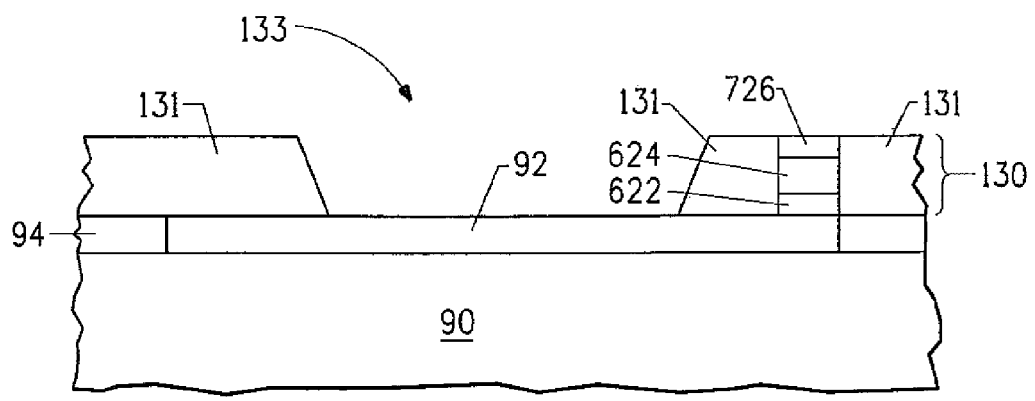
FIG. 13 includes an illustration of a cross-sectional view of the workpiece of FIG. 12 after forming a containment structure.

FIG. 13 includes a cross-sectional view of the workpiece after a containment structure 131 has been formed. The containment structure 131 includes an opening 133 corresponding to the shape of the radiation-emitting or radiation-receiving area of the pixel. Other openings, substantially identical to the opening 133, may be formed for other pixels within the electronic device. The containment structure 131 can include an organic or inorganic insulating material. In an embodiment, the thickness of the containment structure 131 can be at least approximately 0.1 µm, 0.3 µm, or 0.5 µm, and in another embodiment, the thickness can be no greater than approximately 9 µm, 7 µm, or 5 µm. In a particular embodiment, the thickness can be in a range of approximately 1 µm to approximately 5 µm.

In an embodiment, the insulating material for the containment structure 131 can be formed over substantially all of the workpiece. A portion of the insulating material overlying the shunt 130 can be removed using a conventional or proprietary polishing or etch-back technique. The insulating material can then be patterned to form the opening 133. The sidewalls of the openings 133 may be tapered, as illustrated in FIG. 13, vertical (not illustrated) or have an overhang (not illustrated).

Figure 14:
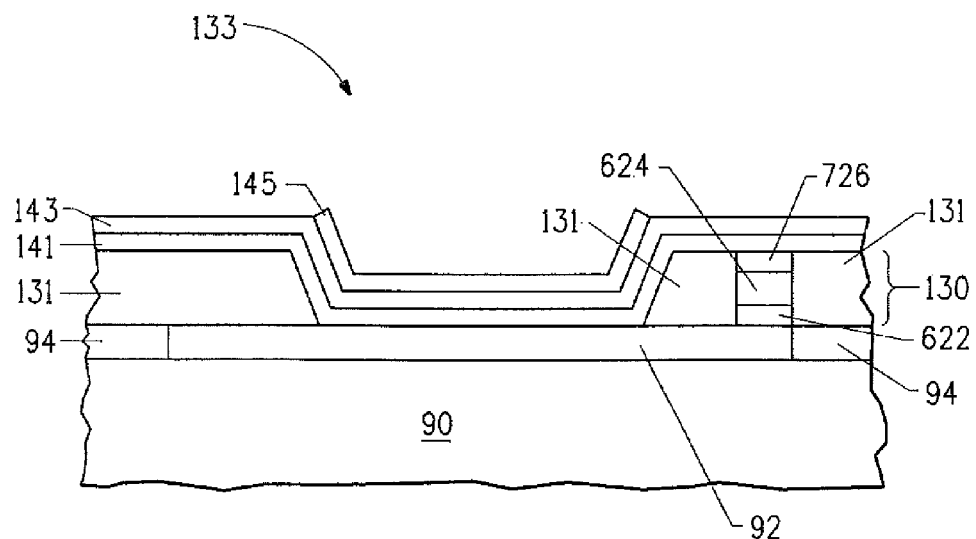
FIG. 14 includes an illustration of a cross-sectional view of the workpiece of FIG. 13 after forming an organic layer over the electrode and shunt.

FIG. 14 includes a cross-sectional view of the workpiece after forming an organic layer over the containment structure 131, the electrode 92, and the shunt 130. The organic layer can include one or more layers, such as a charge-injection layer, a charge-transport layer, a charge-blocking layer, an organic semiconductor layer, or any combination thereof. In a particular embodiment, an electron-blocking layer, a hole-injection layer, a hole-transport layer, or any combination thereof can be formed before forming the organic semiconductor layer, and in another embodiment, a hole-blocking layer, an electron-injection layer, an electron-transport layer, or any combination thereof can be formed after forming the organic semiconductor layer.

In the embodiment as illustrated in FIG. 14, the organic layer includes a buffer layer 141, a hole-transport layer 143, and an organic semiconductor layer 145. In this illustrative embodiment, the buffer layer 141 can include polyaniline ("PANI"), poly(3,4-ethylenedioxythiophene) ("PEDOT"), polypyrrole, material(s) conventionally used as a hole-injection or hole-transport layer as used in an OLED, or any combination thereof. The buffer layer 141 can be doped with a sulfonate compound to make the layer more conductive. In an embodiment, the buffer layer 141 acts as a hole-injection layer.

The hole-transport layer 143 can include a polymer. When the hole-transport layer 143 includes a hole-transport material, the hole-transport layer 143 can include a hole-transport group. Such a hole-transport group includes a carbazole, triarylamine, triarylmethane, fluorene, or any combination thereof. A commonly used hole-transporting polymer includes a polyvinylcarbazole, (phenylmethyl)polysilane, poly(dioxythiophene), polyaniline, polypyrrole, or the like. In addition, a hole-transporting polymer can be made by doping hole-transporting molecules, such as those mentioned above, into a polymer such as polystyrene, polycarbonate, or a combination thereof. In a particular embodiment, the charge-transport layer 84 can include any of the above-mentioned materials and a fullerene. The fullerene can be bucky balls, bucky tubes, or any combination thereof. In a particular embodiment, the buffer layer 141 has a different composition as compared to the hole-transport layer 143. Each of the buffer layer 141 and the hole-transport layer 143 has a thickness in a range of approximately 10 to 250 nm. The thickness of the buffer layer 141 and the hole-transport layer 143 can be locally thinner or potentially discontinuous along the sidewalls of the containment structure 131.

The composition of the organic semiconductor layer 145 can depend upon the application of the electronic device. In the embodiment illustrated in FIG. 14, the organic semiconductor layer 145 is used in radiation-emitting components. The organic semiconductor layer 145 can include material(s) as conventionally used as an organic semiconductor layer in an electronic device and can include one or more small molecule materials, one or more polymer materials, or any combination thereof. After reading this specification, skilled artisans will be capable of selecting appropriate material(s), layer(s) or both for the organic semiconductor layer 145. The organic semiconductor layer 145 can include a radiation-emitting material or a radiation-responsive material. The organic semiconductor layer 145 is formed within the opening 133 of the containment structure 131. In one embodiment, the organic semiconductor layer 145 is no greater than approximately 90 nm. In another embodiment, the organic semiconductor layer 145 has a thickness in a range of approximately 20 to 70 nm. The thickness of the organic semiconductor layer 145 can be locally thinner or potentially discontinuous along the sidewalls of the containment structure 131.

In an embodiment, the organic semiconductor layer 145 may be formed over substantially all of a pixel or sensor array. In another embodiment, the organic semiconductor layer 145 may be formed over some, but not all of the pixels within a pixel or sensor array. In a particular embodiment, the organic semiconductor layer 145 and other organic semiconductor layers can be selectively formed over different portions of the containment structure 131 and within different openings in the containment structure 131. Each of the organic semiconductor layers can include a blue light-emitting layer, a green light-emitting layer, a red-light emitting layer, or a white-light emitting layer. In another embodiment, each of the organic semiconductor layers can emit radiation having an emission maximum at a wavelength within the visible light spectrum or outside the visible light spectrum (e.g., infrared, ultraviolet, etc.). In a full-color display, the organic semiconductor layers can emit different colors of radiation. In still another particular embodiment, yet another organic semiconductor layer may emit white light or may be part of a sensor used as part of an intensity feedback or correction circuit (not illustrated).

The organic semiconductor layer 145 and potentially other organic semiconductor layers can be formed by one or more of any number of different techniques including spin coating, casting, vapor depositing (chemical or vapor), printing (inkjet printing, screen printing, solution dispensing (dispensing the liquid composition in strips or other predetermined geometric shapes or patterns, as seen from a top view), or any combination thereof), other depositing technique or any combination thereof for appropriate materials as described below. In a particular embodiment, the organic semiconductor layers are selectively deposited by printing the materials for the organic semiconductor layers along columns. If needed or desired, the organic semiconductor layers may be cured after deposition.

In an embodiment not illustrated, the organic layer can also include a hole-blocking layer, an electron-transport layer, an electron-injection layer, or any combination thereof. Any one or more of the layers can be blanket deposited or printed over the organic semiconductor layers. Conventional or proprietary materials and deposition techniques can be used to form the hole-blocking layer, the electron-transport layer, the electron-injection layer, or any combination thereof.

Figure 15:
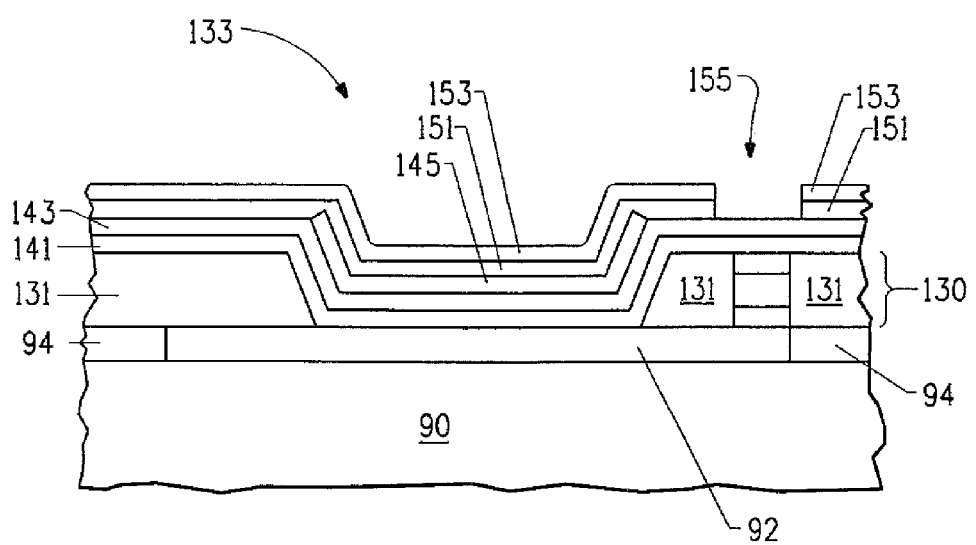
FIG. 15 includes an illustration of a cross-sectional view of the workpiece of FIG. 14 after forming another electrode and a conductive member.

FIG. 15 illustrates a portion of the electronic device after forming an electrode 151 and a conductive member 153 over the organic layer. The electrode 151 and the conductive member 153 can be deposited using a shadow mask (not illustrated) and physical vapor deposition. In the embodiment as illustrated in FIG. 15, the shadow mask includes a feature that can prevent a substantial amount of the conductive layer from being deposited over a region 155 that overlies the shunt 130. Thus, the shadow mask has a feature that corresponds to the shape of the region 155. The shadow mask can include openings where the electrode 151 and the conductive member 153 are formed. After the shadow mask is properly aligned to the electronic device, the conductive layer can be deposited using a conventional or proprietary evaporation or sputtering technique.

As illustrated in FIG. 15, the electrode 151 can act as a cathode for the electronic component 128 being formed, and the conductive member 153 can act as a conductive capping layer over the electrode 151. In an embodiment, the electrode 151 can comprise a metal-containing layer having a low work function (e.g., no greater than 4.4 eV), which is lower than the work function of the electrode 92. Materials for the electrode 151 can include a Group 1 metal (e.g., Li, Cs), a Group 2 (alkaline earth) metal, a rare earth metal including a lanthanides or an actinide. The electrode 151 has a thickness sufficient to set the work function for the electrode. In a particular embodiment, the electrode 151 can have a thickness in a range of approximately 0.3 to 20 nm. In another embodiment, the electrode 151 can be thicker or thinner than the thickness range previously described.

The conductive member 153 can help to lessen exposure of moisture or other materials that may react with the electrode 151 because the Group 1 and Group 2 metals are relatively more reactive than many other elemental metals. The relatively more stable conductive material for the conductive member can include Cr, Al, Mo, Cu, Ti, Ta, a conductive nitride, a noble metal (Pt, Pd, Ag, or Au), a metal capable of forming a conductive oxide (Ru, Rh, Ir, and Os), or any mixture thereof. The conductive member 153 is sufficiently thick to protect underlying layers during a subsequent etch performed to remove the portion of the organic layer overlying the shunt 130. In a particular embodiment, the conductive member 153 can have a thickness in a range of approximately 0.2 to 5 μm. In another embodiment, the conductive member 153 can be thicker or thinner than the thickness range previously described.

Figure 16:
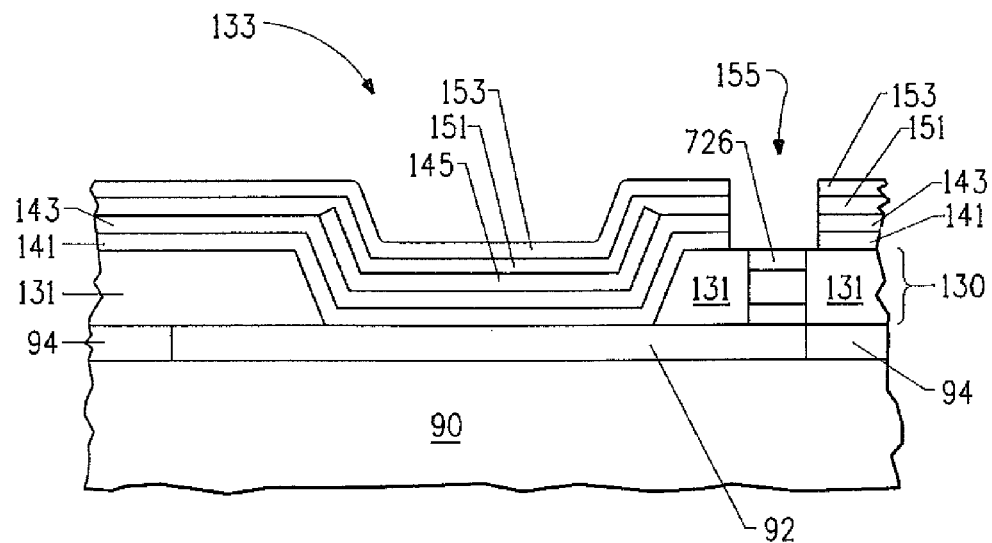
FIG. 16 includes an illustration of a cross-sectional view of the workpiece of FIG. 15 after removing a portion of the organic layer that overlies the shunt.

The portion of the organic layer lying under the region 155 is removed by dry etching to expose the shunt 130, and more particularly, the doped region 726 of the shunt 130, as illustrated in FIG. 16. The conductive member 153 acts as a hard mask to protect portions of the organic layer covered by the conductive member 153. The dry etching can be performed using an oxygen-containing gas, such as include $O_2$, CO, $O_3$, NO, $N_2O$, or any combination thereof.

The dry etch may also include a halogen-containing gas, such as a fluorine-containing gas, a chlorine-containing gas, a bromine-containing gas, or an iodine-containing gas or any combination thereof. The fluorine-containing gas can include a fluorocarbon ($CF_4$, $CHF_3$, $C_2F_6$, or the like), $F_2$, HF, $SF_6$, $NF_3$, fluorine-containing interhalogens (ClF, $ClF_3$, $ClF_5$, $BrF_3$, $BrF_5$, $IF_5$ or the like), or any combination thereof. The chlorine-containing gas can include a chlorocarbon ($CCl_4$, $CHCl_3$, $C_2Cl_6$, or the like), $Cl_2$, HCl, $BCl_3$, chlorine-containing interhalogens (ClF, $ClF_3$, $ClF_5$ or the like), or any combination thereof. The bromine-containing gas may be selected from a group consisting of bromocarbons, $Br_2$, HBr, $BBr_3$, bromine-containing interhalogens ($BrF_3$, $BrF_5$, or the like), or any combination thereof. The iodine-containing gas can include iodocarbons $I_2$, HI, iodine-containing interhalogens (e.g., $IF_5$), or any combination thereof.

The dry etching may further include an inert gas, such as a noble gas, $N_2$, and any combination thereof, or a reducing gas, such as $H_2$, $NH_3$, $N_2H_4$, $N_2H_2$, or any combination thereof.

If sidewall polymer formation is to be avoided, the reducing gas may not be used. In one specific embodiment, gases used during a first dry etching portion can including $O_2$, $CF_4$, and Ar, and the gas of a second dry etching portion may consist essentially of Ar. All other etching parameters may be conventional or proprietary. During the first dry etching portion, substantially all of the exposed organic layer, from a top view, is removed. Thus, portions of the shunt 130 and the containment structure 131 become exposed below region 155. The second dry etching portion may help to remove non-volatile etch products, if any are formed during the first etch portion. The second dry etching portion is optional and may be omitted if desired.

Figure 17:
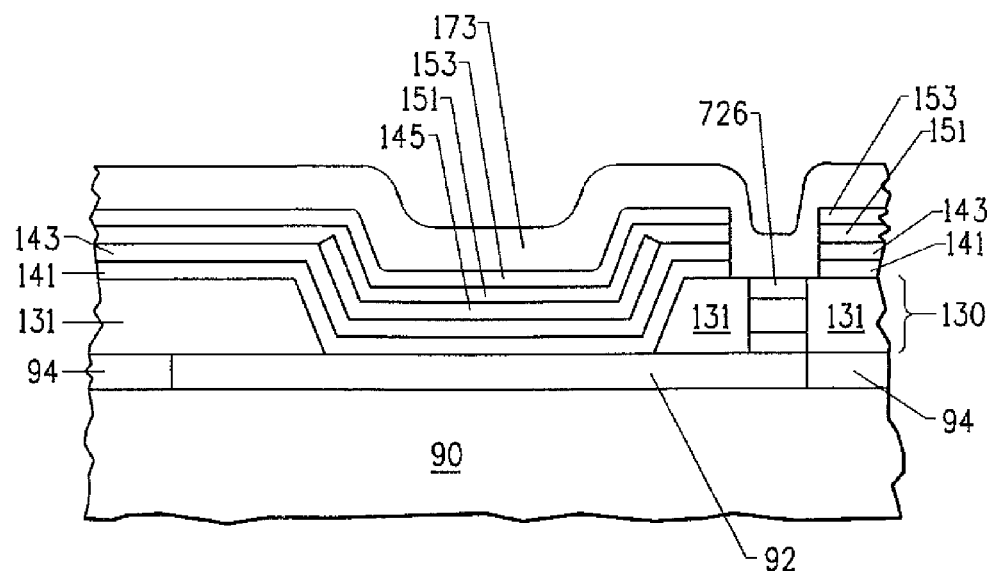
FIG. 17 includes an illustration of a cross-sectional view of the workpiece of FIG. 16 after forming a conductive member that electrically connects the other electrode to the shunt.

FIG. 17 illustrates a portion of the electronic device after forming another conductive member 173 over the workpiece. The conductive member 173 can be deposited over substantially all of the pixel array for the display using a physical vapor deposition. In a particular embodiment, the conductive member 173 includes a part that contacts the conductive member 153 and another part that contacts the doped region 726, and thus, the conductive member 173 straps the conductive member 153 to the shunt 130. Therefore, the electrode 151 and the shunt 130 are electrically connected to each other, and the electronic component 128 and the shunt 130 are electrically connected in parallel. In one embodiment, the conductive member 153 may be electrically connected to a power supply terminal (e.g., $V_{SS}$, $V_{DD}$, or the like).

The conductive member 173 does not require a Group 1 or Group 2 metal, although a Group 1 or Group 2 metal may be used if desire. In a particular embodiment, the conductive member 173 can include a relatively more stable conductive material (compared to a Group 1 or Group 2 metal) such as previously described with respect to the conductive member 153. The conductive member 173 may include an adhesion film, a barrier film, or a combination thereof to improve adhesion to an underlying layer, to reduce an upper film within the conductive member 173 from interacting or causing other adverse conditions with an underlying layer, or any combination thereof. An exemplary adhesion film can include Ti, Ta, or the like, and an exemplary barrier film can include TiN, TaN, WN, silicon-containing compounds of any of the foregoing, or any combination thereof. When the conductive member 153 includes aluminum, the conductive member 153 may also include silicon to reduce the likelihood of junction spiking, copper to improve electromigration resistance, or both silicon and copper (e.g., about 1 wt % each). In another alternative embodiment, an upper barrier layer (not illustrated) can be formed over the conductive member 173 if needed or desired. The conductive member 173 can have a thickness in a range of approximately 0.5 to 25 microns. In another embodiment, the conductive member 173 can be thicker or thinner than the thickness range previously described.

Figure 18:
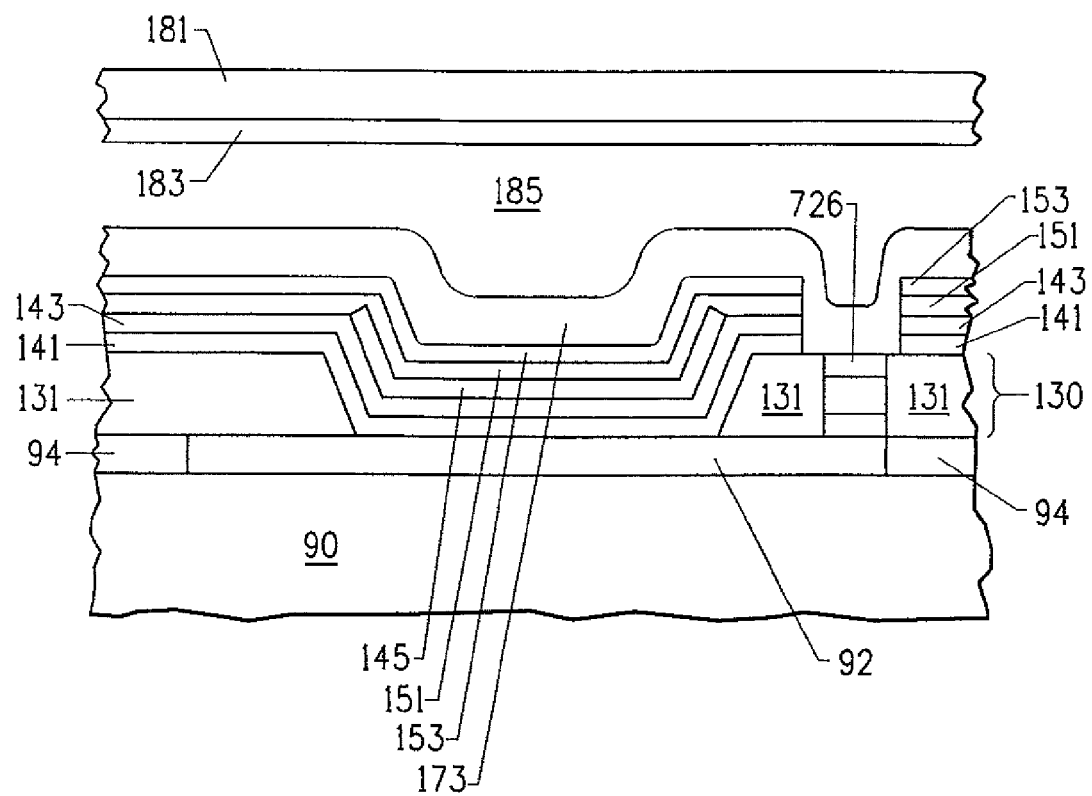
FIG. 18 includes an illustration of a cross-sectional view of a substantially completed electronic device in accordance with an embodiment.

Fabrication is continued to form a substantially completed electronic device, as illustrated in FIG. 18. A lid 181 with a desiccant 193 can be attached to the substrate 90 at locations (not illustrated) outside the array to form a substantially completed device. A gap 185 lies between the lid 181 and the conductive member 173. The materials used for the lid 181 and desiccant 183 and the attaching process are conventional or proprietary.

4. Operation of the Electronic Device

The operation of the electronic device is described with respect to the embodiment illustrated in FIG. 18. During operation of a display, appropriate potentials are placed on the electrodes 92 and 151 (via conductive members 153 and 173) to cause radiation to be emitted from the radiation-emitting components. More specifically, when light is to be emitted, a potential difference between the electrodes 92 and 151 allows electron-hole pairs to combine within the organic semiconductor layer 145, so that light or other radiation may be emitted from the electronic device. In a particular embodiment, the electrode 151 can be electrically connected to the $V_{SS}$ power supply line. In a display, rows and columns can be given signals to activate the appropriate pixels to render a display to a viewer in a human-understandable form.

During operation of a radiation detector, such as a photodetector, the electrode 151 may be at a substantially constant voltage, and a sense amplifier may be coupled to the electrode 92 to detect significant current flow when radiation is received by the electronic device. In a voltaic cell, such as a photovoltaic cell, light or other radiation can be converted to energy that can flow without an external energy source. After reading this specification, skilled artisans are capable of designing the electronic devices, peripheral circuitry, and potentially remote circuitry to best suit their particular needs.

The electronic device may be configured to allow the electronic component 128 to be reversed biased, such as when trapped charge is to be removed or otherwise neutralized within gate dielectric of the power transistor. In such an embodiment, the electrode 151 may be at a voltage significantly higher than the electrode 92. The shunt 130 provides a parallel path to allow current to bypass the electronic component 128, and therefore, improve the long-term reliability of the electronic component 128 and the device. Even if the defect 102 is present, the defect 102 is less likely to result in a failure or may take longer to cause a failure due to the presence of the shunt 130.

5. Alternative Embodiments

Figure 19:
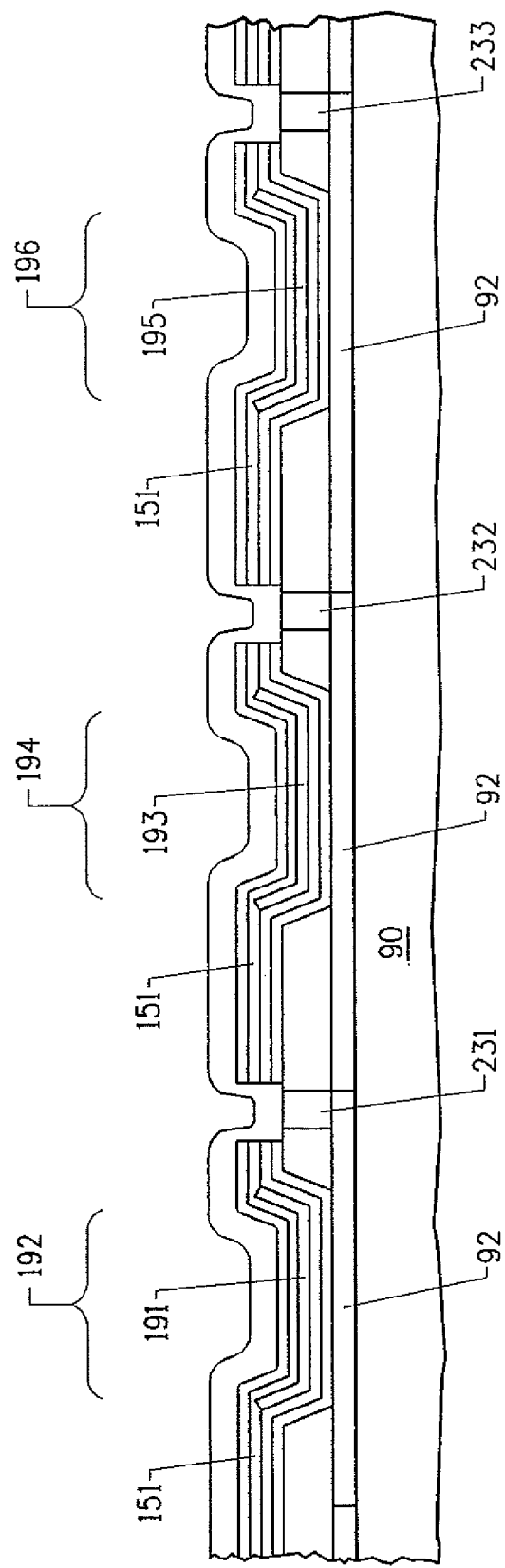
FIG. 19 includes an illustration of a cross-sectional view of a portion of a workpiece including pixels for a full color display.

FIG. 19 includes an illustration of a full color display that includes pixels 192, 194, and 196. In a particular embodiment, the pixel 192 can include a red light-emitting organic semiconductor layer 191, the pixel 194 can include a green light-emitting organic semiconductor layer 193, and the pixel 196 can include a blue light-emitting organic semiconductor layer 195. The pixel 192 can include a shunt 231, the pixel 194 can include a shunt 232, and the pixel 196 can include a shunt 233. The shunts 231, 232, and 233 may be substantially identical to one another or may be different from one another.

Thus, the different types of shunts may be tailored to particular types of pixels. All other layers and features are substantially the same as the embodiments as described in FIGS. 9 to 18.

Many other layouts, materials, and process flows can be used in forming the embodiment described herein in order to achieve a shunt that has the desired electronic characteristics. Thus, the concepts as described herein are highly flexible and can be used with many different layouts and circuit designs.

6. Benefits

The concepts as described herein can be used to form electronic components that are more reliable and less likely to fail or may take longer to fail compared to a conventional OLED under reverse biasing conditions. The shunt can have electronic characteristics that do not significantly affect the performance of the electronic component 128, such as an organic diode, when the electronic component 128 is forward biased. When the electronic component 128 is reversed biased, the shunt provides an alternative current path to reduce current flowing through the electronic component 128.

The shunt can be formed without significantly affecting the aspect ratio of the pixel. Thus, the improved performance with an additional electronic component can be achieved while still maintaining an acceptable aspect ratio for the pixel.

The wide variety of layouts, physical structures, formation techniques, and elevational location of the shunt provide good flexibility in designing a particular shunt and where it is formed within the process sequence.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. An electronic device comprising:
an organic diode; and
a shunt that allows a significant current to bypass the organic diode, wherein the shunt is separate from the organic diode, wherein the shunt comprises a resistive member, a first diode and a second diode, the second diode is characterized as having a significantly lower breakdown voltage than the first diode.

2. The electronic device of claim 1, wherein a first terminal of the shunt is electrically connected to an anode of the organic diode, and a second terminal of the shunt is electrically connected to a cathode of the organic diode.

3. The electronic device of claim 1, wherein the shunt further comprises a first diode that is serially connected to the resistive member.

4. The electronic device of claim 3, wherein:
an anode of the first diode is electrically connected to a cathode of the organic diode;
a cathode of the first diode is electrically connected to a first terminal of the resistive member; and
a second terminal of the resistive member is electrically connected to an anode of the organic diode.

5. The electronic device of claim 1, wherein within the shunt, cathodes of the first and second diodes are more directly coupled to each other than anodes of the first and second diodes.

6. The electronic device of claim 5, wherein:
the anode of the first diode is electrically coupled to a cathode of the organic diode; and
the anode of the second diode is electrically coupled to an anode of the organic diode.

7. The electronic device of claim 6, wherein the resistive member includes:
a first terminal electrically connected to the cathode of the first diode; and
a second terminal electrically connected to the cathode of the second diode.

8. The electronic device of claim 1, wherein a particle lies within an electrode of the organic diode or between an electrode and an organic semiconductor layer of the organic diode.

9. The electronic device of claim 1, wherein:
the organic diode has a characteristic forward-bias resistance; and
the shunt has a characteristic shunt resistance that is in a range of approximately 100 to approximately 1000 times the forward-bias resistance.

10. An electronic device comprising:
an organic diode lying along a first conduction path; and
a resistive member and a first and second diode lying along a second conduction path that is parallel to the first conduction path, wherein the first and second diodes are configured such that when a current would flow along the second conduction path, the first diode would be forward biased and the second diode would be reversed biased.

11. The electronic device of claim 10, wherein the resistive member, the first diode, and the second diode are serially connected in any combination along the second conduction path.

* * * * *